(12) United States Patent
Zhu et al.

(10) Patent No.: US 9,763,339 B2
(45) Date of Patent: Sep. 12, 2017

(54) CURVED SURFACE MODULE, DISPLAY DEVICE AND ITS ASSEMBLING METHOD

(71) Applicants: BOE TECHNOLOGY GROUP CO., LTD., Beijing (CN); BEIJING BOE DISPLAY TECHNOLOGY CO., LTD., Beijing (CN)

(72) Inventors: Kunpeng Zhu, Beijing (CN); Chunbing Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 117 days.

(21) Appl. No.: 14/897,494

(22) PCT Filed: Jul. 15, 2015

(86) PCT No.: PCT/CN2015/084081
§ 371 (c)(1),
(2) Date: Dec. 10, 2015

(87) PCT Pub. No.: WO2016/127569
PCT Pub. Date: Aug. 18, 2016

(65) Prior Publication Data
US 2016/0345446 A1    Nov. 24, 2016

(30) Foreign Application Priority Data
Feb. 11, 2015    (CN) .......................... 2015 1 0073149

(51) Int. Cl.
*G09F 13/04* (2006.01)
*H05K 5/00* (2006.01)
(Continued)

(52) U.S. Cl.
CPC ......... *H05K 5/0017* (2013.01); *G02F 1/1336* (2013.01); *G02F 1/133308* (2013.01);
(Continued)

(58) Field of Classification Search
CPC ..................................................... G02F 1/1336
(Continued)

(56) References Cited

U.S. PATENT DOCUMENTS 9,560,775 B2 *  1/2017  Park .......................... H04N 5/64
2009/0091681 A1  4/2009  Nishizawa et al.
(Continued)

FOREIGN PATENT DOCUMENTS

CN    103823321 A    5/2014
CN    103901655 A    7/2014
(Continued)

OTHER PUBLICATIONS

Written Opinion of the International Searching Authority and International Search Report for International Application No. PCT/CN2015/084081, mailed Oct. 15, 2015. Translation provided by Dragon Intellectual Property Law Firm.

*Primary Examiner* — Jerry Wu
(74) *Attorney, Agent, or Firm* — Harness, Dickey & Pierce, P.L.C.

(57) ABSTRACT

The present disclosure provides a curved surface module, a display device and its manufacturing method. The curved surface module includes a first mold frame, a second mold frame, a first metallic frame, a second metallic frame, a first fastener and a backlight source. An oblique opening is provided at an edge of the second mold frame, and a display panel slot is provided at an edge of the first mold frame. The first mold frame and the second mold frame are secured onto both ends of the backlight source, respectively. The second metallic frame is provided with a bending mechanism which
(Continued)

forms a slot together with the oblique opening of the second mold frame.

20 Claims, 7 Drawing Sheets (51) Int. Cl.
H01L 51/52 (2006.01)
H01L 51/56 (2006.01)
G02F 1/1333 (2006.01)
G02F 1/1335 (2006.01)

(52) U.S. Cl.
CPC ............ H01L 51/524 (2013.01); H01L 51/56 (2013.01); *G02F 2001/133317* (2013.01); *G02F 2001/133342* (2013.01)

(58) Field of Classification Search
USPC .................................................... 361/679.21
See application file for complete search history.

(56) References Cited

U.S. PATENT DOCUMENTS

| 2013/0155655 A1* | 6/2013 | Lee .......................... H05K 5/03 362/97.1 |
| 2015/0323826 A1 | 11/2015 | Hsiao et al. |
| 2016/0345446 A1 | 11/2016 | Zhu et al. |

FOREIGN PATENT DOCUMENTS

| CN | 104049394 A | 9/2014 |
| CN | 104765196 A | 7/2015 |
| JP | H10-268790 A | 10/1998 |

* cited by examiner

CURVED SURFACE MODULE, DISPLAY DEVICE AND ITS ASSEMBLING METHOD

CROSS-REFERENCE TO RELATED APPLICATIONS

This application is the U.S. national phase of PCT Application No. PCT/CN2015/084081 filed on Jul. 15, 2015, which claims a priority of the Chinese Patent Application No. 201510073149.7 filed on Feb. 11, 2015, the disclosures of which are incorporated in their entirety by reference herein.

TECHNICAL FIELD

The present disclosure relates to the manufacture of display device, in particular to a curved surface module, a display device and its assembling method.

BACKGROUND

As an important component of a curved surface display device, a curved surface module can be fitted to a display panel so as to achieve curved-surface display.

Recently, there exist two kinds of curved surface modules. One of them includes a backlight source, a metallic frame and a curved bracket. The metallic frame and the bracket are arranged at both sides of the backlight source, respectively. The backlight source may be a planar backlight source, the metallic frame may be a planar frame, and either of them may be both deformed and thus provided with a curved surface under the pressure of the curved bracket. Also, a planar display panel arranged between the backlight source and the metallic frame may be deformed into a curved-surface display panel under the pressure of the curved bracket. The other of them includes a curved metallic frame and a curved-surface backlight source, and a curved-surface display panel may be arranged between the curved metallic frame and the curved-surface backlight source.

However, for the existing curved surface modules, during the curved-surface display, it is required to provide a fixation mechanism, e.g., the metallic frame or the curved bracket, at at least one side of the backlight source, resulting in a relatively large thickness of the curved surface module. As a result, it is impossible to provide a thin curved surface module while achieving the curved-surface display.

SUMMARY

An object of the present disclosure is to provide a curved surface module, a display device and its assembling method, so as to provide a thin curved surface module while achieving the curved-surface display.

In one aspect, the present disclosure provides in some embodiments a curved surface module, including a first mold frame, a second mold frame, a first metallic frame, a second metallic frame, a first fastener and a backlight source. An oblique opening is provided at an edge of the second mold frame, and a display panel slot is provided at an edge of the first mold frame. The first mold frame and the second mold frame are secured onto both ends of the backlight source, respectively, the oblique opening of the second mold frame and the display panel slot the first mold frame are arranged at a first side of the backlight source, and the first side is a light-emitting side of the backlight source. The first metallic frame is secured to a side of the first mold frame away from the backlight source, the second metallic frame is secured to a side of the second mold frame away from the backlight source, and the second metallic frame is provided with a bending mechanism which forms a slot together with the oblique opening of the second mold frame. The display panel slot of the first mold frame is configured to receive one end of a display panel, the slot formed by the bending mechanism of the second metallic frame and the oblique opening of the second mold frame is configured to receive the other end of the display panel, and the first fastener is configured to press the second metallic frame against the second mold frame, so as to apply a force by the bending mechanism of the second metallic frame onto the display panel, thereby to enable a middle portion of the display panel to be curved in a direction close to the backlight source.

Alternatively, when the backlight source is a planar backlight source with a plurality of light-emitting surfaces, the curved surface module further includes a second fastener. An oblique opening is provided at another edge of the first mold frame, a display panel slot is arranged at another edge of the second mold frame, the oblique opening of the first mold frame and the display panel slot of the second mold frame are arranged at a second side of the backlight source, and the second side is another light-emitting side of the backlight source and arranged opposite to the first side of the backlight source. The first metallic frame is provided with a bending mechanism which forms a slot together with the oblique opening of the first mold frame. The slot formed by the bending mechanism of the first metallic frame and the oblique opening of the first mold frame is configured to receive one end of a further display panel, the display panel slot of the second mold frame is configured to receive the other end of the further display panel, and the second fastener is configured to press the first metallic frame against the first mold frame, so as to apply a force by the bending mechanism of the first metallic frame onto the further display panel, thereby to enable a middle portion of the further display panel to be curved in a direction close to the backlight source.

Alternatively, the curved surface module further includes two parallel adhesive tapes, two ends of each adhesive tape are connected to the first mold frame and the second mold frame, respectively, and the two adhesive tapes, the first mold frame and the second mold frame form a square mold frame which is sleeved onto the backlight source. The first mold frame and the second mold frame are each provided with a backlight source slot which receives either one of the two ends of the backlight source.

Alternatively, the curved surface module further includes a square metallic frame which is sleeved onto the backlight source, and the first mold frame and the second mold frame are secured to an outer side of the square metallic frame and arranged at the two ends of the backlight source, respectively.

Alternatively, the backlight source is an organic light-emitting diode (OLED).

Alternatively, the first fastener is a screw, and the second fastener is a screw.

In another aspect, the present disclosure provides in some embodiments a display device including a display panel and the above-mentioned curved surface module. One end of the display panel is received in a display panel slot of a first mold frame, the other end of the display panel is received in a slot formed by a bending mechanism of a second metallic frame and an oblique opening of a second mold frame, and a middle portion of the display panel is curved in a direction close to the backlight source.

Alternatively, the display device further includes a further display panel, the backlight source is a planar backlight source with a plurality of light-emitting surfaces, and the curved surface module includes a second fastener. An oblique opening is provided at another edge of the first mold frame, a display panel slot is provided at another edge of the second mold frame, the oblique opening of the first mold frame and the display panel slot of the second mold frame are arranged at a second side of the backlight source, and the second side is another light-emitting side of the backlight source and arranged opposite to a first side of the backlight source. A first metallic frame is provided with a bending mechanism which forms a slot together with the oblique opening of the first mold frame. The slot formed by the bending mechanism of the first metallic frame and the oblique opening of the first mold frame is configured to receive one end of the further display panel, the display panel slot of the second mold frame is configured to receive the other end of the further display panel, and the second fastener is configured to press the first metallic frame against the first mold frame, so as to apply a force by the bending mechanism of the first metallic frame, thereby to enable a middle portion of the further display panel in a direction close to the backlight source.

Alternatively, the display device further includes a first strip-like frame and a second strip-like frame. One end of the first strip-like frame is secured to an edge of the first mold frame, the other end of the first strip-like frame is secured to the bending mechanism of the second metallic frame, and the first strip-like frame is of a curvature identical to the display panel. One end of the second strip-like frame is secured to another edge of the second mold frame, the other end of the second strip-like frame is secured to the bending mechanism of the first metallic frame, and the second strip-like frame is of a curvature identical to the further display panel.

Alternatively, the first strip-like frame and the second strip-like frame are each made of a galvanized steel sheet.

In yet another aspect, the present disclosure provides in some embodiments a method for assembling a display device which includes a display panel and the above-mentioned curved surface module, including steps of: securing a first mold frame and a second mold frame onto two ends of a backlight source, respectively; enabling one end of the display panel to be received in a display panel slot of the first mold frame; placing the other end of the display panel within an oblique opening of the second mold frame, the oblique opening of the second mold frame and the display panel slot of the first mold frame being arranged at a first side of the backlight source, the first side being a light-emitting side of the backlight source; placing a second metallic frame at a side of the second mold frame away from the backlight source, so as to enable the other end of the display panel to be received in a slot formed by a bending mechanism of the second metallic frame and the oblique opening of the second mold frame; pressing the second metallic frame against the second mold frame through a first fastener, so as to apply a force by the bending mechanism of the second metallic frame to the display panel, thereby to enable a middle portion of the display panel to be curved in a direction close to the backlight source; and securing a first metallic frame onto a side of the first mold frame away from the backlight source.

Alternatively, the display device further includes a further display panel, and the backlight source is a planar backlight source with a plurality of light-emitting surfaces. Subsequent to pressing the second metallic frame against the second mold frame through the first fastener, the method further includes: enabling one end of the further display panel to be received in a display panel slot of the second slot; and placing the other end of the further display panel in an oblique opening of the first mold frame, the oblique opening of the first mold frame and the display panel slot of the second mold frame being arranged at a second side of the backlight source, the second side being another light-emitting side of the backlight source. The step of securing the first metallic frame onto the side of the first mold frame away from the backlight source includes: placing the first metallic frame at the side of the first mold frame away from the backlight source, so as to enable the other end of the other display panel to be received in a slot formed by a bending mechanism of the first metallic frame and the oblique opening of the first mold frame; and pressing the first metallic frame against the first mold frame through a second fastener, so as to apply a force by the bending mechanism of the first metallic frame onto the further display panel, thereby to enable a middle portion of the further display panel to be curved in a direction close to the backlight source.

Alternatively, the display device further includes a first strip-like frame and a second strip-like frame. Subsequent to pressing the first metallic frame against the first mold frame through the second fastener, the method further includes: securing one end of the first strip-like frame to an edge of the first mold frame, and securing the other end of the first strip-like frame to the bending mechanism of the second metallic frame, the first strip-like frame being of a curvature identical to the display panel; and securing one end of the second strip-like frame to an edge of the second mold frame, and securing the other end of the second strip-like frame to the bending mechanism of the first metallic frame, the second strip-like frame being of a curvature identical to the further display panel.

Alternatively, the curved surface module further includes two parallel adhesive tapes, two ends of each adhesive tape are connected to the first mold frame and the second mold frame, respectively, and the two adhesive tapes, the first mold frame and the second mold frame form a square mold frame. The step of securing the first mold frame and the second mold frame onto the two ends of the backlight source, respectively, includes: sleeving the square mold frame onto the backlight source, and enabling the two ends of the backlight source to be received in backlight source slots of the first mold frame and the second mold frame, respectively.

Alternatively, the curved surface module further includes a square metallic frame. The step of securing the first mold frame and the second mold frame onto the two ends of the backlight source, respectively, includes: sleeving the square metallic frame onto the backlight source; and securing the first mold frame and the second mold frame onto an outer side of the square metallic frame and at the two ends of the backlight source, respectively.

According to the curved surface module, the display device and its assembling method in the embodiments of the present disclosure, it is merely required to provide the mold frames and the metallic frames at both sides of the backlight source, without any need to provide a fixation mechanism at at least one side of the backlight source, so it is able to reduce a thickness of the curved surface module. Meanwhile, the display panel slot of the first mold frame is configured to receive one end of the display panel, the slot formed by the bending mechanism of the second metallic frame and the oblique opening of the second mold frame is configured to receive the other end of the display panel, and the first fastener is configured to press the second metallic frame against the second mold frame, so it is able to apply a force by the bending mechanism of the second metallic frame onto the display panel, thereby to enable a middle portion of the display panel to be curved in a direction close to the backlight source and achieve the curved surface display. As a result, it is able to provide a thin curved surface module while achieving the curved surface display.

It should be appreciated that, the above descriptions and the details described hereinafter are for illustrative purposes, but shall not be used to limit the scope of the present disclosure.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

The above drawings relate to some embodiments of the present disclosure, and more details will be given hereinafter. These drawings and the relevant descriptions are provided so as to illustrate the concepts of the present disclosure with reference to some specific embodiments, but shall not be construed as limiting the scope of the present disclosure in any way.

DETAILED DESCRIPTION

The present disclosure will be described hereinafter in conjunction with the drawings and the embodiments. Obviously, the following embodiments are for illustrative purposes only, but shall not be used to limit the scope of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In order to make the objects, the technical solutions and the advantages of the present disclosure more apparent, the present disclosure will be described hereinafter in conjunction with the drawings and embodiments.

Figure 1:
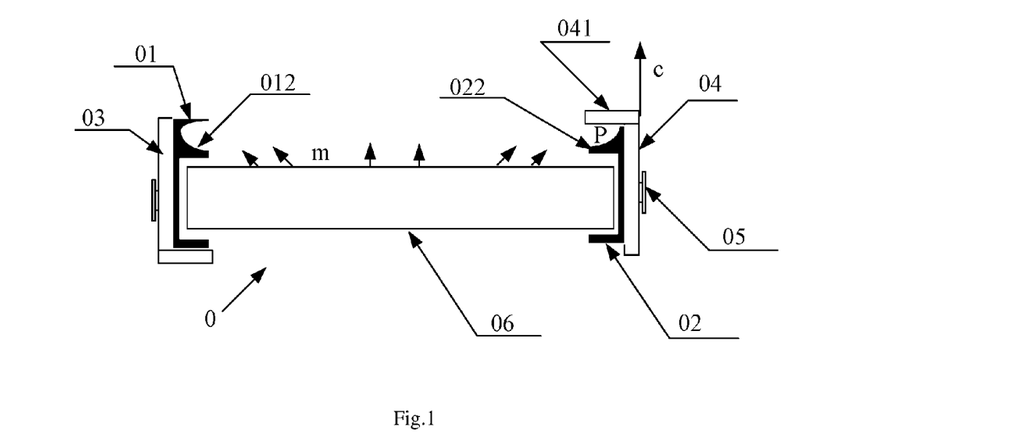
FIG. 1 is a top view of a curved surface module according to one embodiment of the present disclosure.

As shown in FIG. 1, which is a top view of a curved surface module 0 according to one embodiment of the present disclosure, the curved surface module 0 includes a first mold frame 01, a second mold frame 02, a first metallic frame 03, a second metallic frame 04, a first fastener 05 and a backlight source 06. An oblique opening 022 is provided at an edge of the second mold frame 02. The oblique opening 022 may be arranged at a predetermined angle relative to a lengthwise direction c of the second mold frame 02. The predetermined angle may be a fixed angle, linearly-varied angles, or non-linearly-varied angles. For example, the oblique opening 022 may be in the form of a quarter of a circle. A display panel slot 012 is provided at an edge of the first mold frame 01, so as to receive one end of a display panel (not shown). For example, the display panel slot 012 may be a U-shaped slot, and its edge may be rounded so as to prevent the display panel from being damaged.

The first mold frame 01 and the second mold frame 02 are secured onto both ends of the backlight source 06, respectively, the oblique opening 022 of the second mold frame 02 and the display panel slot 012 of the first mold frame 01 are arranged at a first side of the backlight source 06, and the first side is a light-emitting side (side m in FIG. 1) of the backlight source 06.

The first metallic frame 03 is secured to a side of the first mold frame 01 away from the backlight source 06, the second metallic frame 04 is secured to a side of the second mold frame 02 away from the backlight source 06, and the second metallic frame 04 is provided with a bending mechanism 041 which forms a slot P together with the oblique opening 022 of the second mold frame 02. For example, the second metallic frame 04 may be a metallic panel with its one end being curved by 90° in a direction toward the first mold frame 01, and the bending mechanism 041 is just arranged at the curved position.

The slot P formed by the bending mechanism 041 of the second metallic frame 04 and the oblique opening 022 of the second mold frame 02 is configured to receive the other end of the display panel. The first fastener 05 is configured to press the second metallic frame 04 against the second mold frame 02, so as to apply a force by the bending mechanism 041 of the second metallic frame 04 onto the display panel, thereby to enable a middle portion of the display panel to be curved in a direction close to the backlight source 06. For example, the first fastener 05 may be a screw which passes through the second metallic frame 04 and screwed into the second mold frame 02. By tightening the screw, it is able to gradually press the second metallic frame 04 against the second mold frame 02 and even enable the second metallic frame 04 to be embedded into the second mold frame 02, thereby to enable the bending mechanism 041 of the second metallic frame 04 to apply a force onto the display panel at a position where the bending mechanism 041 is in contact with the display panel. In FIG. 1, the first mold frame 01 at one end (i.e., a left side) of the backlight source 06 is secured to the backlight source 06 so as to apply a force to the display panel, and a force is applied by the second mold frame 02 at the other end (i.e., a right side) of the backlight source 06 to the display panel due to the first fastener 05, so that both ends of the display panel are pressed, thereby to enable a middle portion of the display panel to be curved in a direction close to the backlight source 06. Alternatively, a distance between the first mold frame 01 and the second mold frame 02 is substantially equal to a length of the backlight source 06. In the embodiments of the present disclosure, when the display panel is in a planar state, its length may be greater than the length of the backlight source 06. The display panel may be a liquid crystal display panel.

Alternatively, the first metallic frame 03 and the second metallic frame 04 may each be made of a galvanized steel sheet.

In a word, according to the curved surface module in the embodiments of the present disclosure, it is merely required to provide the mold frames and the metallic frames at both sides of the backlight source, without any need to provide a fixation mechanism at at least one side of the backlight source, so it is able to reduce a thickness of the curved surface module. Meanwhile, the display panel slot of the first mold frame is configured to receive one end of the display panel, the slot formed by the bending mechanism of the second metallic frame and the oblique opening of the second mold frame is configured to receive the other end of the display panel, and the first fastener is configured to press the second metallic frame against the second mold frame, so as to apply a force by the bending mechanism of the second metallic frame onto the display panel, thereby to enable a middle portion of the display panel to be curved in a direction close to the backlight source and achieve the curved surface display. As a result, it is able to provide a thin curved surface module while achieving the curved surface display.

Figure 2:
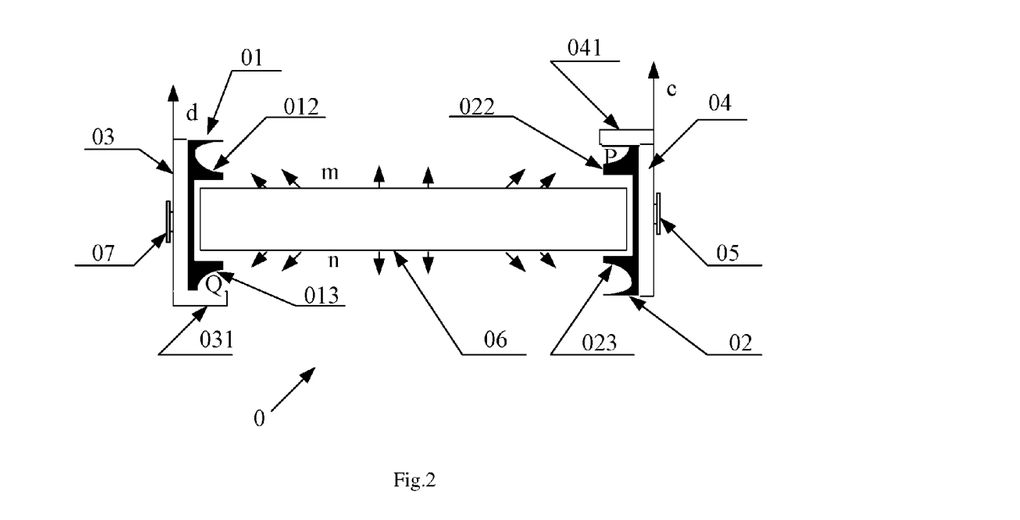
FIG. 2 is another top view of the curved surface module according to one embodiment of the present disclosure.

The backlight source 06 may be a planar backlight source with a single light-emitting surface, or, as shown in FIG. 2, a planar backlight source with a plurality of light-emitting surfaces. The planar backlight source 06 with a plurality of light-emitting surfaces may include a backlight source with double light-emitting surfaces, e.g., an organic light-emitting diode (OLED). At this time, the curved surface module 0 may further include a second fastener 07.

An oblique opening 013 is provided at another edge of the first mold frame 01, and it may be arranged at a predetermined angle relative to a lengthwise direction d of the first mold frame 01 (the lengthwise direction d of the first mold frame 02 may be substantially parallel to the lengthwise direction c of the second mold frame 02). The predetermined angle may be a fixed angle, a linearly-varied angle or a non-linearly-varied angle. For example, the oblique opening 013 may be a quarter of a circle. A display panel slot 023 is arranged at another edge of the second mold frame 02, the oblique opening 013 of the first mold frame 01 and the display panel slot 023 of the second mold frame 02 are arranged at a second side of the backlight source 06, and the second side is another light-emitting side (e.g., side n in FIG. 2) of the backlight source 06.

The first metallic frame 03 is provided with a bending mechanism 031 which forms a slot Q together with the oblique opening 013 of the first mold frame 01. For example, the first metallic frame 03 may be a metallic panel with its one end being bent by 90° in a direction toward the first mold frame 01, and the bending mechanism 031 of the first metallic frame 03 is just at the bending position.

The slot Q formed by the bending mechanism 031 of the first metallic frame 03 and the oblique opening 013 of the first mold frame 01 is configured to receive one end of a further display panel (not shown in FIG. 2), and the display panel slot 023 of the second mold frame 02 is configured to receive the other end of the further display panel. For example, the display panel slot 023 may be a U-shaped slot, and its edge may be rounded so as to prevent the further display panel from being damaged. The second fastener 07 is configured to press the first metallic frame 03 against the first mold frame 01, so as to apply a force by the bending mechanism 031 of the first metallic frame 03 onto the further display panel, thereby to enable a middle portion of the further display panel to be curved in a direction close to the backlight source 06. For example, the second fastener 07 may be a screw which passes through the first metallic frame 03 and is screwed into the first frame 01. By tightening the screw, it is able to gradually press the first metallic frame 03 against the first mold frame 01 and even enable the first metallic frame 03 to be embedded into the first mold frame 01, thereby to apply a force by the bending mechanism 031 of the first metallic frame 03 to the further display panel at a position where the bending mechanism 031 is in contact with the further display panel. In FIG. 2, the second mold frame 02 at the other end (i.e., a left side) of the backlight source 06 is secured to the backlight source 06 so as to apply a force to the further display panel, and a force may be applied by the first mold frame 01 at one end (i.e., a right side) of the backlight source 06 together with the backlight source 06 to the further display panel due to the second fastener 07, so that both ends of the further display panel are pressed, thereby to enable a middle portion of the further display panel to be curved in a direction close to the backlight source 06. Alternatively, a distance between the first mold frame 01 and the second mold frame 02 is substantially equal to the length of the backlight source 06. In the embodiments of the present disclosure, when the further display panel is in a planar state, its length may be greater than the length of the backlight source 06. The further display panel may be a liquid crystal display panel.

For an arc, its radius of curvature refers to a radius of a circle which contains the arc. The larger the radius of curvature, the flatter the arc, and the smaller the radius of curvature, the steeper the arc. A radius of curvature of a curved surface formed by pressing the display panel may be 5500 µm to 6500 µm, and a radius of curvature of a curved surface formed by pressing the further display panel may also be 5500 µm to 6500 µm.

In the embodiments of the present disclosure, the slot formed by the bending mechanism of the first metallic frame and the oblique opening of the first mold frame is configured to receive one end of the further display panel, and the display panel slot of the second mold frame is configured to receive the other end of the further display panel, so it is able for the second fastener to press the first metallic frame against the first mold frame and apply a force by the bending mechanism of the first metallic frame to the further display panel, thereby to enable a middle portion of the further display panel to be curved in a direction close to the backlight source and achieve the curved surface display. Meanwhile, due to the curved surface module, it is able to achieve double-curved-surface display by the display panel and the further display panel.

Alternatively, the first mold frame 01 and the second mold frame 02 may be secured to both ends of the backlight source 06 in various modes, and two modes will be described hereinafter.

Figure 3:
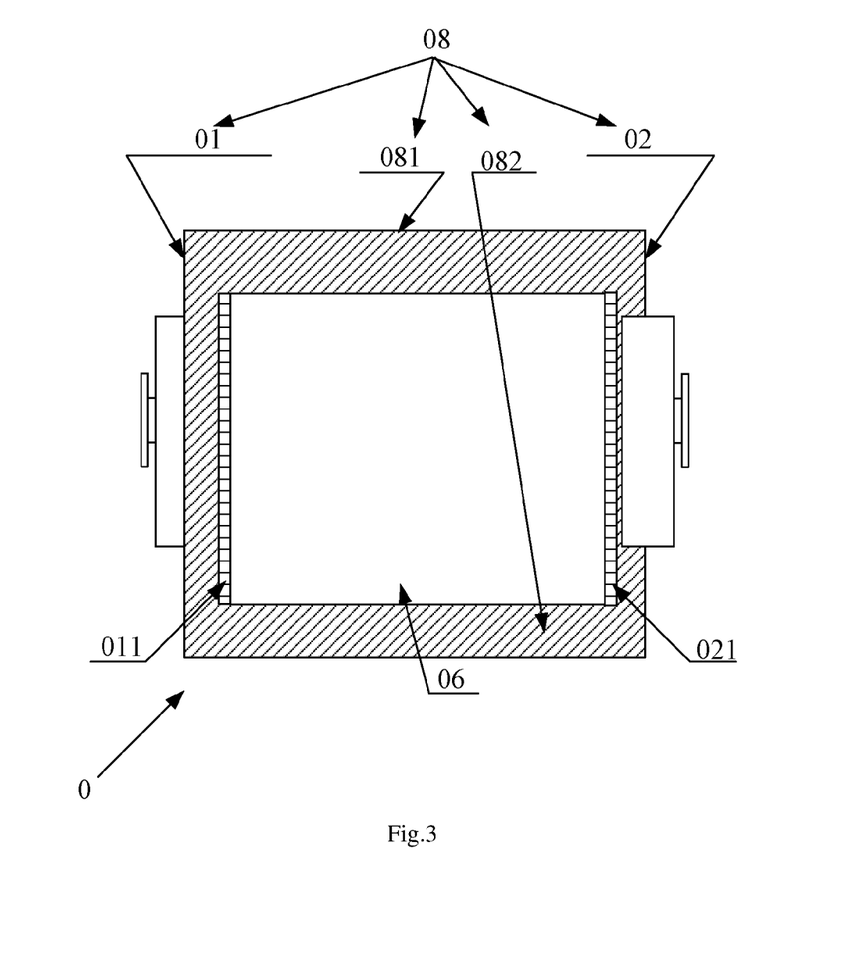
FIG. 3 is a front view of the curved surface module according to one embodiment of the present disclosure.

On one hand, as shown in FIG. 3, the curved surface module includes two parallel adhesive tapes, i.e., a first adhesive tape 081 and a second adhesive tape 082. Two ends of each adhesive tape are connected to the first mold frame 01 and the second mold frame 02, respectively, and the two adhesive tapes, the first mold frame 01 and the second mold frame 02 form a square mold frame 08 which is sleeved onto the backlight source 06.

The first mold frame 01 and the second mold frame 02 are provided with backlight source slots 011 and 021, respectively, and the two ends of the backlight source 06 are received in the backlight source slots. In this way, it is able to secure the first mold frame and the second mold frame to the backlight source. In addition, the square mold frame may be used to prevent the edge of the backlight source from being damaged.

Figure 4:
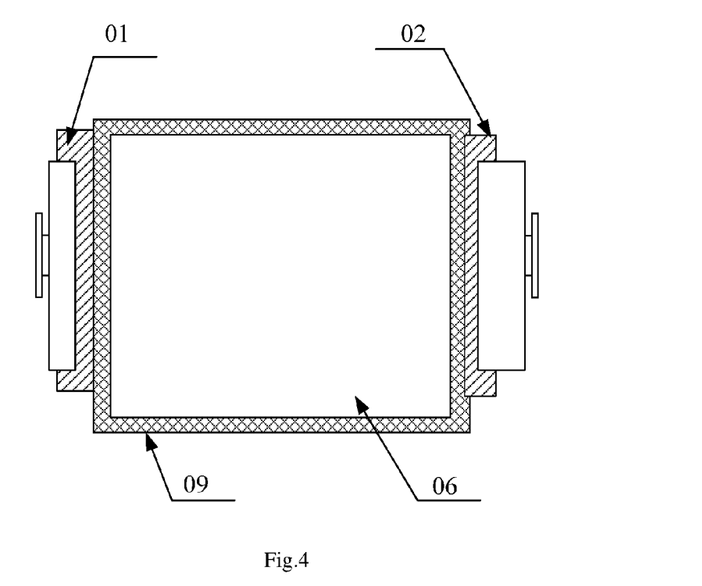
FIG. 4 is another front view of the curved surface module according to one embodiment of the present disclosure.

On the other hand, as shown in FIG. 4, a square metallic frame 09 is sleeved onto the backlight source 06, and the first mold frame 01 and the second mold frame 02 are secured to an outer side of the square metallic frame 09 and arranged at the two ends of the backlight source 06, respectively. For example, the first mold frame 01 and the second mold frame 02 may be secured onto the square metallic frame 09 through fasteners such as screws, and the square metallic square may be used to prevent the edge of the backlight source from being damaged.

According to the curved surface module in the embodiments of the present disclosure, it is merely required to provide the mold frames and the metallic frames at both sides of the backlight source, without any need to provide a fixation mechanism at at least one side of the backlight source, so it is able to reduce a thickness of the curved surface module. Meanwhile, the display panel slot of the first mold frame is configured to receive one end of the display panel, the slot formed by the bending mechanism of the second metallic frame and the oblique opening of the second mold frame is configured to receive the other end of the display panel, and the first fastener is configured to press the second metallic frame against the second mold frame, so as to apply a force by the bending mechanism of the second metallic frame onto the display panel, thereby to enable a middle portion of the display panel to be curved in a direction close to the backlight source and achieve the curved surface display. As a result, it is able to provide a thin curved surface module while achieving the curved surface display. In addition, because the slot formed by the bending mechanism of the first metallic frame and the oblique opening of the first mold frame is configured to receive one end of the further display panel, and the display panel slot of the second mold frame is configured to receive the other end of the further display panel, it is able for the second fastener to press the first metallic frame against the first mold frame, and it is able to apply a force by the bending mechanism of the first metallic frame to the further display panel and enable a middle portion of the further display panel to be curved in a direction close to the backlight source, thereby to achieve the curved surface display by the further display panel. Meanwhile, due to the curved surface module, it is able to achieve the double-curved-surface display by the display panel and the further display panel.

Figure 5:
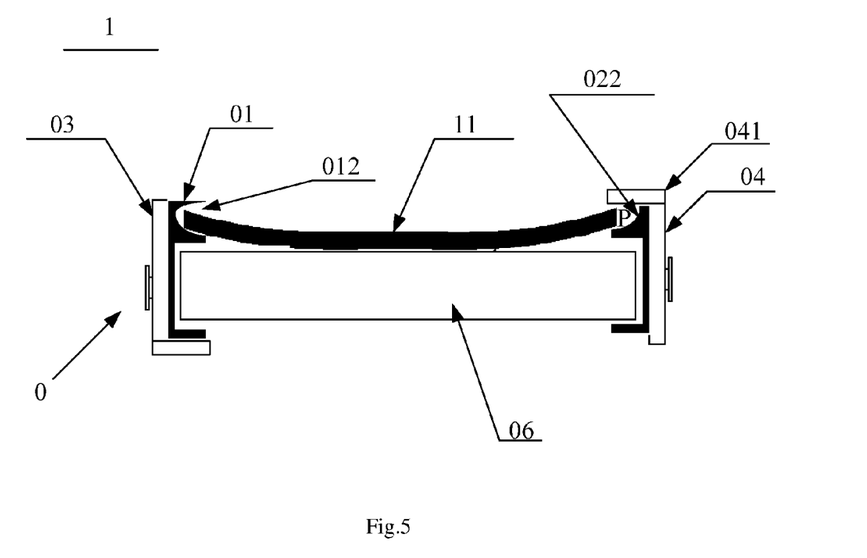
FIG. 5 is a top view of a display device according to one embodiment of the present disclosure.

The present disclosure further provides in some embodiments a display device 1 which may be a curved-surface liquid crystal TV. As shown in FIG. 5, the display device 1 includes a display panel 11 and the curved surface module 0 in FIG. 1 or 2.

When the display device includes the curved surface module 0 in FIG. 1, one end of the display panel 11 is received in the display panel slot 012 of the first mold frame 01, the other end is received in the slot P formed by the bending mechanism 041 of the second metallic frame 04 and the oblique opening 022 of the second mold frame 02, and the two ends of the display panel 11 are curved in a direction away from the backlight source 06.

According to the display device in the embodiments of the present disclosure, it is merely required to provide the mold frames and the metallic frames at both sides of the backlight source, without any need to provide a fixation mechanism at at least one side of the backlight source, so it is able to reduce a thickness of the curved surface module as well as a thickness of the display device. Meanwhile, the display panel slot of the first mold frame is configured to receive one end of the display panel, the slot formed by the bending mechanism of the second metallic frame and the oblique opening of the second mold frame is configured to receive the other end of the display panel, and the first fastener is configured to press the second metallic frame against the second mold frame, so it is able to apply a force by the bending mechanism of the second metallic frame onto the display panel, thereby to enable a middle portion of the display panel to be curved in a direction close to the backlight source and achieve the curved surface display. As a result, it is able to provide a thin display device while achieving the curved surface display.

Figure 6:
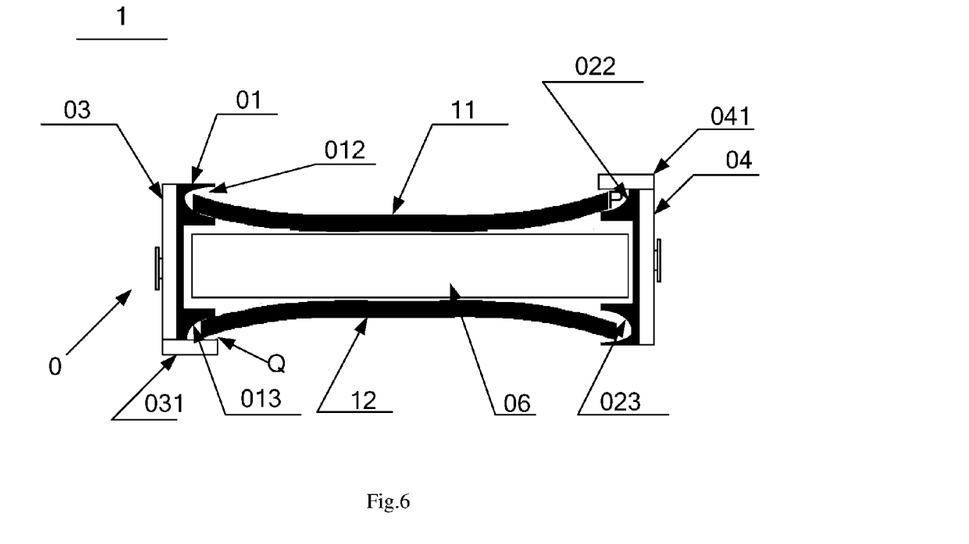
FIG. 6 is another top view of the display device according to one embodiment of the present disclosure.

Further, the backlight source 06 may be a planar backlight source with a plurality of light-emitting surfaces. The planar backlight source may be a backlight source with double light-emitting surfaces, e.g., an OLED. When the display device 1 includes the curved surface module 0 in FIG. 2, it may include a further display panel 12 as shown in FIG. 6.

One end of the further display panel 12 is received in the slot Q formed by the bending mechanism 031 of the first metallic frame 03 and the oblique opening 013 of the first mold frame 01, the other end is received in the display panel slot 023 of the second mold frame 02, and both ends of the further display panel 12 are curved in a direction away from the backlight source 06.

Alternatively, the first metallic frame 03 and the second metallic frame 04 may each be made of a galvanized steel sheet.

In a word, because the slot formed by the bending mechanism of the first metallic frame and the oblique opening of the first mold frame is configured to receive one end of the further display panel, and the display panel slot of the second mold frame is configured to receive the other end of the further display panel, it is able for the second fastener to press the first metallic frame against the first mold frame, and it is able to apply a force by the bending mechanism of the first metallic frame to the further display panel and enable a middle portion of the further display panel to be curved in a direction close to the backlight source, thereby to achieve the curved surface display by the further display panel. Meanwhile, due to the curved surface module, it is able to achieve the double-curved-surface display by the display panel and the further display panel.

Figure 7:
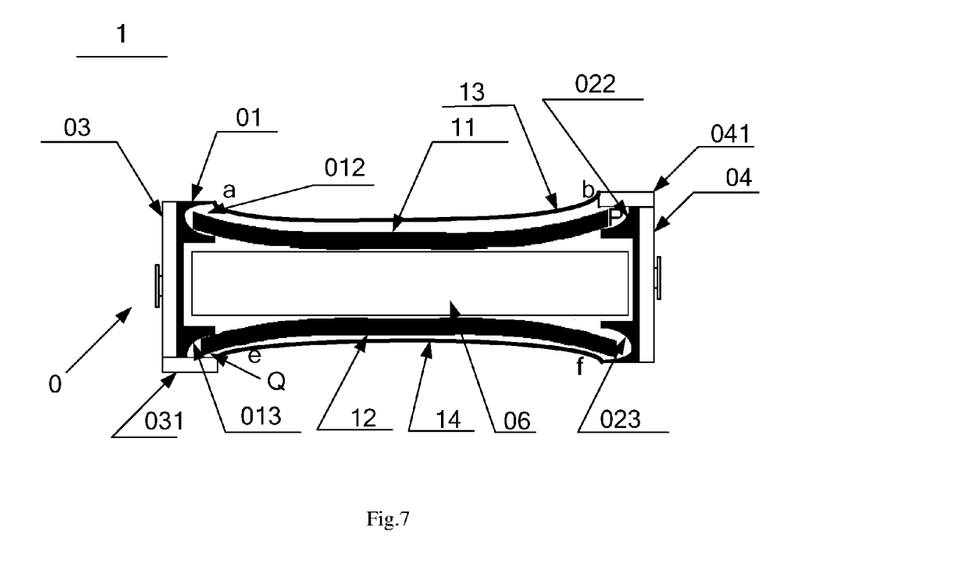
FIG. 7 is yet another top view of the display device according to one embodiment of the present disclosure.

Alternatively, as shown in FIG. 7, when the display device 1 includes the curved surface module 0 in FIG. 2, it may further include a first strip-like frame 13 and a second strip-like frame 14.

One end a of the first strip-like frame 13 is secured to an edge of the first mold frame 01, the other end b of the first strip-like frame 13 is secured to the bending mechanism 041 of the second metallic frame 04, and the first strip-like frame 13 is of a curvature identical to the display panel 11. The first strip-like frame 13 may be arranged at an edge of the display panel 11, so as to prevent the display of the display panel 11 from being adversely affected. For example, there may exist only one first strip-like frame 13 arranged at an upper or lower end of the display panel 11, or there may exist two first strip-like frames 13 arranged at the upper and lower ends of the display panel 11, respectively.

One end f of the second strip-like frame 14 is secured to another edge of the second mold frame 02, the other end e of the second strip-like frame 14 is secured to the bending mechanism 031 of the first metallic frame 03, and the second strip-like frame 14 is of a curvature identical to the further display panel 12. The second strip-like frame 14 may be arranged at an edge of the further display panel 12, so as to prevent the display of the further display panel 12 from being adversely affected. For example, there may exist only one second strip-like frame 14 arranged at an upper or lower end of the further display panel 12, or there may exist two second strip-like frames 14 arranged at the upper and lower ends of the further display panel 12, respectively.

In the embodiments, through the first strip-like frame, it is able to secure the display panel effectively, and through the second strip-like frame, it is able to secure the further display panel effectively. The strip-like frames may be made of a strip-like metal sheet. For example, the first strip-like frame and the second strip-like frame may each be made of a galvanized steel sheet.

Further, the display device in the embodiments of the present disclosure may further include such components as a circuit frame, a front frame and a rear housing. The display device may any product or member having a display function, such as a mobile phone, a flat-panel computer, a television, a display, a laptop computer, a digital photo frame or a navigator, which is not particularly defined herein.

In a word, because the slot formed by the bending mechanism of the first metallic frame and the oblique opening of the first mold frame is configured to receive one end of the further display panel, and the display panel slot of the second mold frame is configured to receive the other end of the further display panel, it is able for the second fastener to press the first metallic frame against the first mold frame, and it is able to apply a force by the bending mechanism of the first metallic frame to the further display panel and enable a middle portion of the further display panel to be curved in a direction close to the backlight source, thereby to achieve the curved surface display of the further display panel. Meanwhile, due to the curved surface module, it is able to achieve the double-curved-surface display by the display panel and the further display panel.

An assembling method and an assembling principle for the display device in the embodiments of the present disclosure will be described hereinafter.

Figure 8:
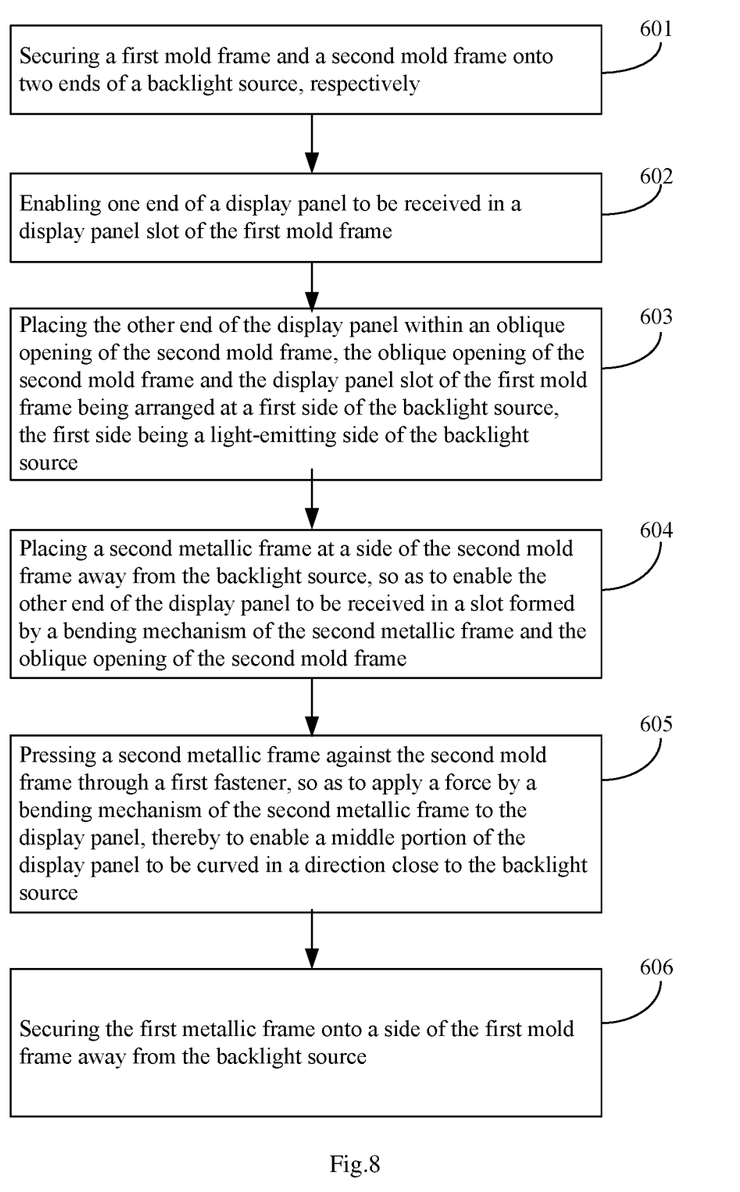
FIG. 8 is a flow chart of an assembling method for the display device according to one embodiment of the present disclosure.

The present disclosure provides in some embodiments an assembling method for the display device. As shown in FIG. 8, when the display device includes the display panel and the curved surface module in FIG. 1 or 2, the assembling method includes: Step 601 of securing the first mold frame and the second mold frame onto two ends of the backlight source, respectively; Step 602 of enabling one end of the display panel to be received in the display panel slot of the first mold frame; Step 603 of placing the other end of the display panel within the oblique opening of the second mold frame, the oblique opening of the second mold frame and the display panel slot of the first mold frame being arranged at the first side of the backlight source, the first side being a light-emitting side of the backlight source; Step 604 of placing the second metallic frame at a side of the second mold frame away from the backlight source, so as to enable the other end of the display panel to be received in a slot formed by a bending mechanism of the second metallic frame and the oblique opening of the second mold frame; Step 605 of pressing the second metallic frame against the second mold frame through the first fastener, so as to apply a force by the bending mechanism of the second metallic frame to the display panel, thereby to enable a middle portion of the display panel to be curved in a direction close to the backlight source; and Step 606 of securing the first metallic frame onto a side of the first mold frame away from the backlight source.

According to the assembling method in the embodiments of the present disclosure, it is merely required to provide the mold frames and the metallic frames at both sides of the backlight source, without any need to provide a fixation mechanism at at least one side of the backlight source, so it is able to reduce a thickness of the curved surface module as well as a thickness of the display device. Meanwhile, the display panel slot of the first mold frame is configured to receive one end of the display panel, the slot formed by the bending mechanism of the second metallic frame and the oblique opening of the second mold frame is configured to receive the other end of the display panel, and the first fastener is configured to press the second metallic frame against the second mold frame, so it is able to apply a force by the bending mechanism of the second metallic frame onto the display panel, thereby to enable a middle portion of the display panel to be curved in a direction close to the backlight source and achieve the curved surface display. As a result, it is able to provide a thin display device while achieving the curved surface display.

Figure 9:
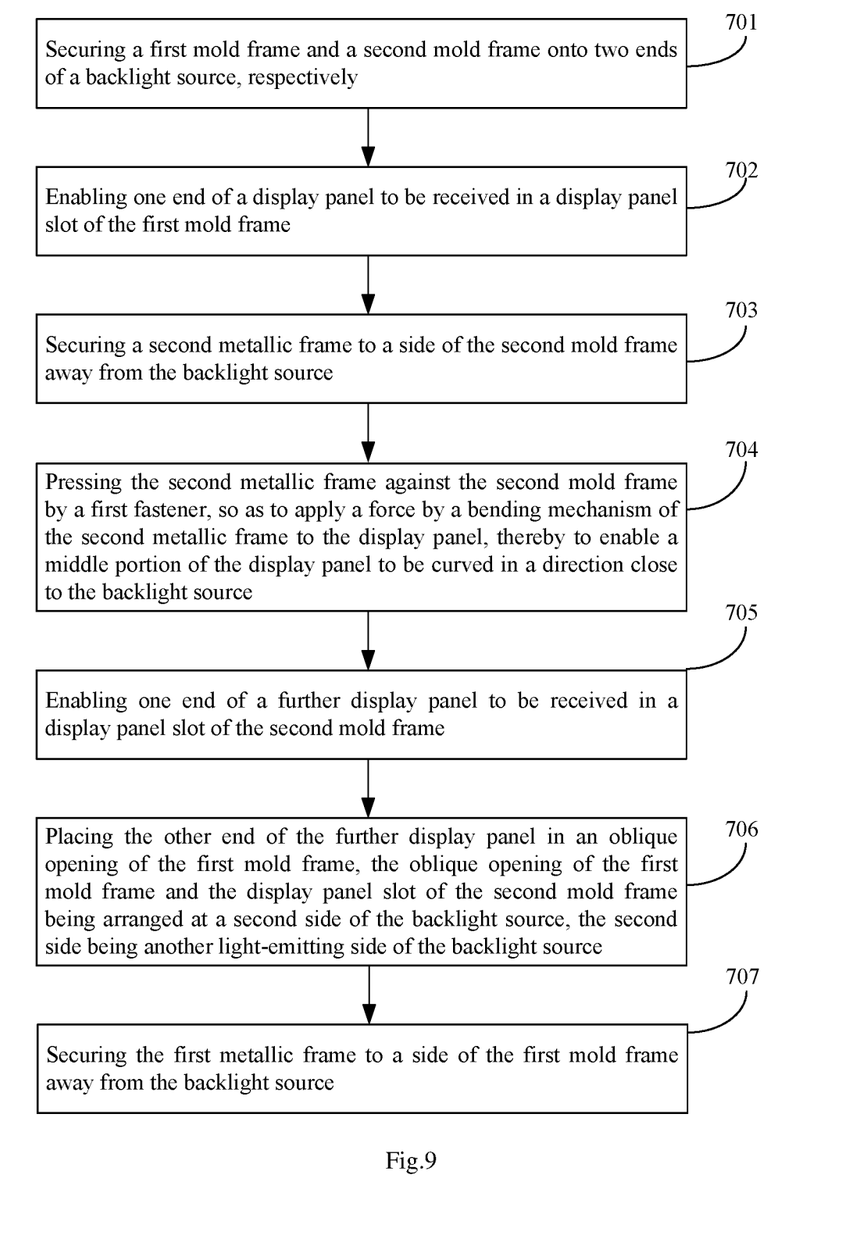
FIG. 9 is another flow chart of the assembling method for the display device according to one embodiment of the present disclosure.

As shown in FIG. 9, when the display device includes the display panel and the curved surface module in FIG. 2 or 3, the assembling method may include the following steps.

Step 701: securing the first mold frame and the second mold frame onto the two ends of the backlight source, respectively.

On one hand, as shown in FIG. 3, the curved surface module further includes two parallel adhesive tapes. Two ends of each adhesive tape are connected to the first mold frame and the second mold frame, respectively, and the two adhesive tapes, the first mold frame and the second mold frame form a square mold frame. At this time, Step 701 may include sleeving the square mold frame onto the backlight source, and enabling the two ends of the backlight source to be received in backlight source slots of the first mold frame and the second mold frame, respectively. In this way, it is able to effectively secure the first mold frame and the second mold frame to the backlight source. In addition, the square mold frame may be used to prevent the edge of the backlight source from being damaged.

On the other hand, as shown in FIG. 4, the curved surface module further includes a square metallic frame, and at this time, Step 701 may include sleeving the square metallic frame onto the backlight source; and securing the first mold frame and the second mold frame onto an outer side of the square metallic frame and at the two ends of the backlight source, respectively.

Step 702: enabling one end of the display panel to be received in the display panel slot of the first mold frame.

Step 703: securing the second metallic frame to a side of the second mold frame away from the backlight source. This step may include: placing the other end of the display panel within the oblique opening of the second mold frame, the oblique opening of the second mold frame and the display panel slot of the first mold frame being arranged at a first side of the backlight source, the first side being a light-emitting side of the backlight source; and placing the second metallic frame at a side of the second mold frame away from the backlight source, so as to enable the other end of the display panel to be received in the slot formed by the bending structure of the second metallic frame and the oblique opening of the second mold frame.

Step 704: pressing the second metallic frame against the second mold frame by the first fastener, so as to apply a force by the bending mechanism of the second metallic frame to the display panel, thereby to enable a middle portion of the display panel to be curved in a direction close to the backlight source.

Step 705: enabling one end of the further display panel to be received in the display panel slot of the second mold frame.

Step 706: placing the other end of the further display panel in the oblique opening of the first mold frame, the oblique opening of the first mold frame and the display panel slot of the second mold frame being arranged at the second side of the backlight source, the second side being another light-emitting side of the backlight source.

Step 707: securing the first metallic frame to a side of the first mold frame away from the backlight source.

Figure 10:
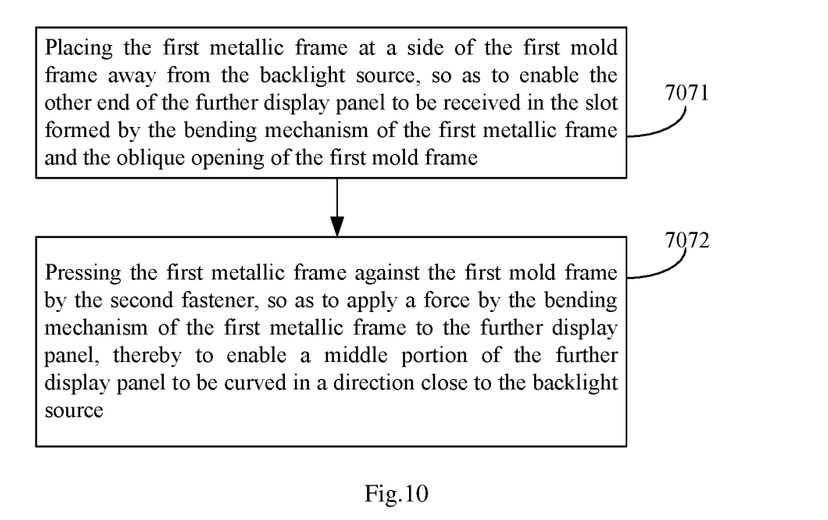
FIG. 10 is a flow chart of a method for securing a first metallic frame according to one embodiment of the present disclosure.

In addition, as shown in FIG. 10, Step 707 may include: Step 7071 of placing the first metallic frame at a side of the first mold frame away from the backlight source, so as to enable the other end of the further display panel to be received in the slot formed by the bending mechanism of the first metallic frame and the oblique opening of the first mold frame; and Step 7072 of pressing the first metallic frame against the first mold frame by the second fastener, so as to apply a force by the bending mechanism of the first metallic frame to the further display panel, thereby to enable a middle portion of the further display panel to be curved in a direction close to the backlight source.

In a word, because the slot formed by the bending mechanism of the first metallic frame and the oblique opening of the first mold frame is configured to receive one end of the further display panel, and the display panel slot of the second mold frame is configured to receive the other end of the further display panel, it is able for the second fastener to press the first metallic frame against the first mold frame, apply a force by the bending mechanism of the first metallic frame to the further display panel and enable a middle portion of the further display panel to be curved in a direction close to the backlight source, thereby to achieve the curved surface display by the further display panel. Meanwhile, due to the curved surface module, it is able to achieve the double-curved-surface display by the display panel and the further display panel.

Further, when the display device includes the curved surface module in FIG. 3, subsequent to Step 7072, the assembling method further includes: securing one end of the first strip-like frame to an edge of the first mold frame, and securing the other end of the first strip-like frame to the bending mechanism of the second metallic frame, the first strip-like frame being of a curvature identical to the display panel; and securing one end of the second strip-like frame to an edge of the second mold frame, and securing the other end of the second strip-like frame to the bending mechanism of the first metallic frame, the second strip-like frame being of a curvature identical to the other display panel.

In the embodiments of the present disclosure, through the first strip-like frame, it is able to effectively secure the display panel, and through the second strip-like frame, it is able to effectively secure the further display panel.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A curved surface module, comprising a first mold frame, a second mold frame, a first metallic frame, a second metallic frame, a first fastener and a backlight source, wherein an oblique opening is provided at an edge of the second mold frame, and a display panel slot is provided at an edge of the first mold frame;

the first mold frame and the second mold frame are secured onto both ends of the backlight source, respectively; the oblique opening of the second mold frame and the display panel slot of the first mold frame are arranged at a first side of the backlight source, and the first side of the backlight source is a light-emitting side of the backlight source;

the first metallic frame is secured to a side of the first mold frame away from the backlight source, the second metallic frame is secured to a side of the second mold frame away from the backlight source, and the second metallic frame is provided with a bending mechanism which forms a slot together with the oblique opening of the second mold frame; and the display panel slot of the first mold frame is configured to receive one end of a display panel, the slot formed by the bending mechanism of the second metallic frame and the oblique opening of the second mold frame is configured to receive the other end of the display panel, and the first fastener is configured to press the second metallic frame against the second mold frame, so as to apply a force by the bending mechanism of the second metallic frame onto the display panel, thereby to enable a middle portion of the display panel to be curved in a direction close to the backlight source.

2. The curved surface module according to claim 1, wherein when the backlight source is a planar backlight source with a plurality of light-emitting surfaces, the curved surface module further comprises a second fastener;

an oblique opening is provided at another edge of the first mold frame, a display panel slot is arranged at another edge of the second mold frame, the oblique opening of the first mold frame and the display panel slot of the second mold frame are arranged at a second side of the backlight source, and the second side is another light-emitting side of the backlight source and arranged opposite to the first side of the backlight source;

the first metallic frame is provided with a bending mechanism which forms a slot together with the oblique opening of the first mold frame; and the slot formed by the bending mechanism of the first metallic frame and the oblique opening of the first mold frame is configured to receive one end of a further display panel, the display panel slot of the second mold frame is configured to receive the other end of the further display panel, and the second fastener is configured to press the first metallic frame against the first mold frame, so as to apply a force by the bending mechanism of the first metallic frame onto the further display panel, thereby to enable a middle portion of the further display panel to be curved in a direction close to the backlight source.

3. The curved surface module according to claim 1, further comprising two parallel adhesive tapes,
wherein two ends of each adhesive tape are connected to the first mold frame and the second mold frame, respectively, and the two adhesive tapes, the first mold frame and the second mold frame form a square mold frame which is sleeved onto the backlight source; and
the first mold frame and the second mold frame are each provided with a backlight source slot which receives either one of the two ends of the backlight source.

4. The curved surface module according to claim 1, further comprising a square metallic frame which is sleeved onto the backlight source,
wherein the first mold frame and the second mold frame are secured to an outer side of the square metallic frame and arranged at the two ends of the backlight source, respectively.

5. The curved surface module according to claim 1, wherein the backlight source is an organic light-emitting diode (OLED).

6. The curved surface module according to claim 1, wherein the first fastener is a screw.

7. The curved surface module according to claim 2, wherein the second fastener is a screw.

8. A display device, comprising:
a display panel; and
the curved surface module according to claim 1, wherein one end of the display panel is received in a display panel slot of a first mold frame, the other end of the display panel is received in a slot formed by a bending mechanism of a second metallic frame and an oblique opening of a second mold frame, and a middle portion of the display panel is curved in a direction close to the backlight source.

9. The display device according to claim 8, further comprising a further display panel, wherein
the backlight source is a planar backlight source with a plurality of light-emitting surfaces, and the curved surface module comprises a second fastener;
an oblique opening is provided at another edge of the first mold frame, a display panel slot is provided at another edge of the second mold frame, the oblique opening of the first mold frame and the display panel slot of the second mold frame are arranged at a second side of the backlight source, and the second side is another light-emitting side of the backlight source and arranged opposite to a first side of the backlight source;
a first metallic frame is provided with a bending mechanism which forms a slot together with the oblique opening of the first mold frame; and
the slot formed by the bending mechanism of the first metallic frame and the oblique opening of the first mold frame is configured to receive one end of the further display panel, the display panel slot of the second mold frame is configured to receive the other end of the further display panel, and the second fastener is configured to press the first metallic frame against the first mold frame, so as to apply a force by the bending mechanism of the first metallic frame, thereby to enable a middle portion of the further display panel in a direction close to the backlight source.

10. The display device according to claim 9, further comprising a first strip-like frame and a second strip-like frame, wherein
one end of the first strip-like frame is secured to an edge of the first mold frame, the other end of the first strip-like frame is secured to the bending mechanism of the second metallic frame, and the first strip-like frame is of a curvature identical to the display panel and
one end of the second strip-like frame is secured to another edge of the second mold frame, the other end of the second strip-like frame is secured to the bending mechanism of the first metallic frame, and the second strip-like frame is of a curvature identical to the further display panel.

11. The display device according to claim 10, wherein the first strip-like frame and the second strip-like frame are each made of a galvanized steel sheet.

12. An assembling method for a display device, the display device comprising a display panel and the curved surface module according to claim 1, the assembling method comprising steps of:
securing a first mold frame and a second mold frame onto two ends of a backlight source, respectively;
enabling one end of the display panel to be received in a display panel slot of the first mold frame;
placing the other end of the display panel within an oblique opening of the second mold frame, the oblique opening of the second mold frame and the display panel slot of the first mold frame being arranged at a first side of the backlight source, the first side being a light-emitting side of the backlight source;
placing a second metallic frame at a side of the second mold frame away from the backlight source, so as to enable the other end of the display panel to be received in a slot formed by a bending mechanism of the second metallic frame and the oblique opening of the second mold frame;
pressing the second metallic frame against the second mold frame through a first fastener, so as to apply a force by the bending mechanism of the second metallic frame to the display panel, thereby to enable a middle portion of the display panel to be curved in a direction close to the backlight source; and
securing a first metallic frame onto a side of the first mold frame away from the backlight source.

13. The assembling method according to claim 12, wherein the display device further comprises a further display panel, and the backlight source is a planar backlight source with a plurality of light-emitting surfaces;
subsequent to pressing the second metallic frame against the second mold frame through the first fastener, the assembling method further comprises:
enabling one end of the further display panel to be received in a display panel slot of the second slot; and
placing the other end of the further display panel in an oblique opening of the first mold frame, the oblique opening of the first mold frame and the display panel slot of the second mold frame being arranged at a second side of the backlight source, the second side being another light-emitting side of the backlight source, and the step of securing the first metallic frame onto the side of the first mold frame away from the backlight source comprises:

placing the first metallic frame at the side of the first mold frame away from the backlight source, so as to enable the other end of the other display panel to be received in a slot formed by a bending mechanism of the first metallic frame and the oblique opening of the first mold frame; and pressing the first metallic frame against the first mold frame through a second fastener, so as to apply a force by the bending mechanism of the first metallic frame onto the further display panel, thereby to enable a middle portion of the further display panel to be curved in a direction close to the backlight source.

14. The assembling method according to claim 13, wherein the display device further comprises a first strip-like frame and a second strip-like frame, and subsequent to pressing the first metallic frame against the first mold frame through the second fastener, the assembling method further comprises:

securing one end of the first strip-like frame to an edge of the first mold frame, and securing the other end of the first strip-like frame to the bending mechanism of the second metallic frame, the first strip-like frame being of a curvature identical to the display panel; and securing one end of the second strip-like frame to an edge of the second mold frame, and securing the other end of the second strip-like frame to the bending mechanism of the first metallic frame, the second strip-like frame being of a curvature identical to the further display panel.

15. The assembling method according to claim 12, wherein the curved surface module further comprises two parallel adhesive tapes, two ends of each adhesive tape are connected to the first mold frame and the second mold frame, respectively, and the two adhesive tapes, the first mold frame and the second mold frame form a square mold frame, and the step of securing the first mold frame and the second mold frame onto the two ends of the backlight source, respectively, comprises:

sleeving the square mold frame onto the backlight source, and enabling the two ends of the backlight source to be received in backlight source slots of the first mold frame and the second mold frame, respectively.

16. The assembling method according to claim 12, wherein the curved surface module further comprises a square metallic frame, and the step of securing the first mold frame and the second mold frame onto the two ends of the backlight source, respectively, comprises:

sleeving the square metallic frame onto the backlight source; and securing the first mold frame and the second mold frame onto an outer side of the square metallic frame and at the two ends of the backlight source, respectively.

17. The curved surface module according to claim 2, further comprising two parallel adhesive tapes, wherein two ends of each adhesive tape are connected to the first mold frame and the second mold frame, respectively, and the two adhesive tapes, the first mold frame and the second mold frame form a square mold frame which is sleeved onto the backlight source; and the first mold frame and the second mold frame are each provided with a backlight source slot which receives either one of the two ends of the backlight source.

18. The curved surface module according to claim 2, further comprising a square metallic frame which is sleeved onto the backlight source, wherein the first mold frame and the second mold frame are secured to an outer side of the square metallic frame and arranged at the two ends of the backlight source, respectively.

19. The assembling method according to claim 13, wherein the curved surface module further comprises two parallel adhesive tapes, two ends of each adhesive tape are connected to the first mold frame and the second mold frame, respectively, and the two adhesive tapes, the first mold frame and the second mold frame form a square mold frame, and the step of securing the first mold frame and the second mold frame onto the two ends of the backlight source, respectively, comprises:

sleeving the square mold frame onto the backlight source, and enabling the two ends of the backlight source to be received in backlight source slots of the first mold frame and the second mold frame, respectively.

20. The assembling method according to claim 13, wherein the curved surface module further comprises a square metallic frame, and the step of securing the first mold frame and the second mold frame onto the two ends of the backlight source, respectively, comprises:

sleeving the square metallic frame onto the backlight source; and securing the first mold frame and the second mold frame onto an outer side of the square metallic frame and at the two ends of the backlight source, respectively.

* * * * *